US005677632A

United States Patent [19]

Meeker

[11] Patent Number: 5,677,632

[45] Date of Patent: Oct. 14, 1997

[54] AUTOMATIC CALIBRATION FOR A CAPACITIVE PICKUP CIRCUIT

[75] Inventor: Michael B. Meeker, Kenosha, Wis.

[73] Assignee: Snap-on Technologies, Inc., Crystal Lake, Ill.

[21] Appl. No.: 394,489

[22] Filed: Feb. 27, 1995

[51] Int. Cl.[6] .......... G01R 1/04; G01R 31/02; G01R 35/00; F02P 11/00

[52] U.S. Cl. .......... 324/380; 324/601

[58] Field of Search .......... 324/115, 388, 324/399, 379, 126, 127, 380, 601; 123/630, 479; 364/551, 571

[56] References Cited

U.S. PATENT DOCUMENTS

| | | | |
|---|---|---|---|
| 4,064,450 | 12/1977 | Morales et al. | 324/15 |
| 4,401,948 | 8/1983 | Miura et al. | 324/378 |
| 4,490,799 | 12/1984 | Marino et al. | 364/551 |
| 4,547,859 | 10/1985 | Wiggins | 364/571 |
| 5,017,874 | 5/1991 | Di Nunzio et al. | 324/378 |
| 5,087,882 | 2/1992 | Iwata | 324/388 |
| 5,160,892 | 11/1992 | Makhija et al. | 324/379 |
| 5,162,725 | 11/1992 | Hodson et al. | 324/115 |
| 5,189,373 | 2/1993 | Murata et al. | 324/399 |
| 5,196,798 | 3/1993 | Baeza et al. | 324/388 |
| 5,215,067 | 6/1993 | Shimasaki et al. | 123/630 |
| 5,226,394 | 7/1993 | Shimasaki et al. | 123/479 |
| 5,237,279 | 8/1993 | Shimasaki et al. | 324/391 |
| 5,245,873 | 9/1993 | Fathauer et al. | 73/304 |
| 5,309,884 | 5/1994 | Fukui et al. | 123/481 |
| 5,322,045 | 6/1994 | Hisaki et al. | 123/406 |

OTHER PUBLICATIONS

Brown, Gerald R., "How to Read and Interpret Automotive Oscilloscope Patterns", pp. 3–5, 29–31, Reston Publishing, 1985.

*Primary Examiner*—Ernest F. Karlsen
*Assistant Examiner*—Barry C. Bowser
*Attorney, Agent, or Firm*—Emrich & Dithmar

[57] ABSTRACT

A calibrating pickup circuit detects, using primary and secondary pickups, the primary and secondary voltages of an ignition coil of known turns ratio. The pickup circuit includes a programmable gain amplifier, responsive to the detected secondary voltage waveform signal and to a gain control feedback signal for generating an amplified secondary voltage waveform signal wherein the feedback signal has an initial predetermined value in calibration mode and has a calibration value in signal monitor mode. A waveform multiplexing circuit is selectively operable in calibration mode to alternately sample the primary and the amplified secondary voltage waveform signals over a predetermined period to generate a single interlaced waveform signal. Waveform comparison is then performed by evaluating the single interlaced waveform signal and a secondary-to-primary ratio calculated representative of the signal strength difference between analogous portions of the primary and the amplified secondary voltage waveform signals A calibration value is then determined on the basis of the secondary-to-primary ratio and the known turns ratio of the ignition coil.

21 Claims, 3 Drawing Sheets

PRIMARY WAVEFORM

SECONDARY WAVEFORM

SUPERIMPOSED

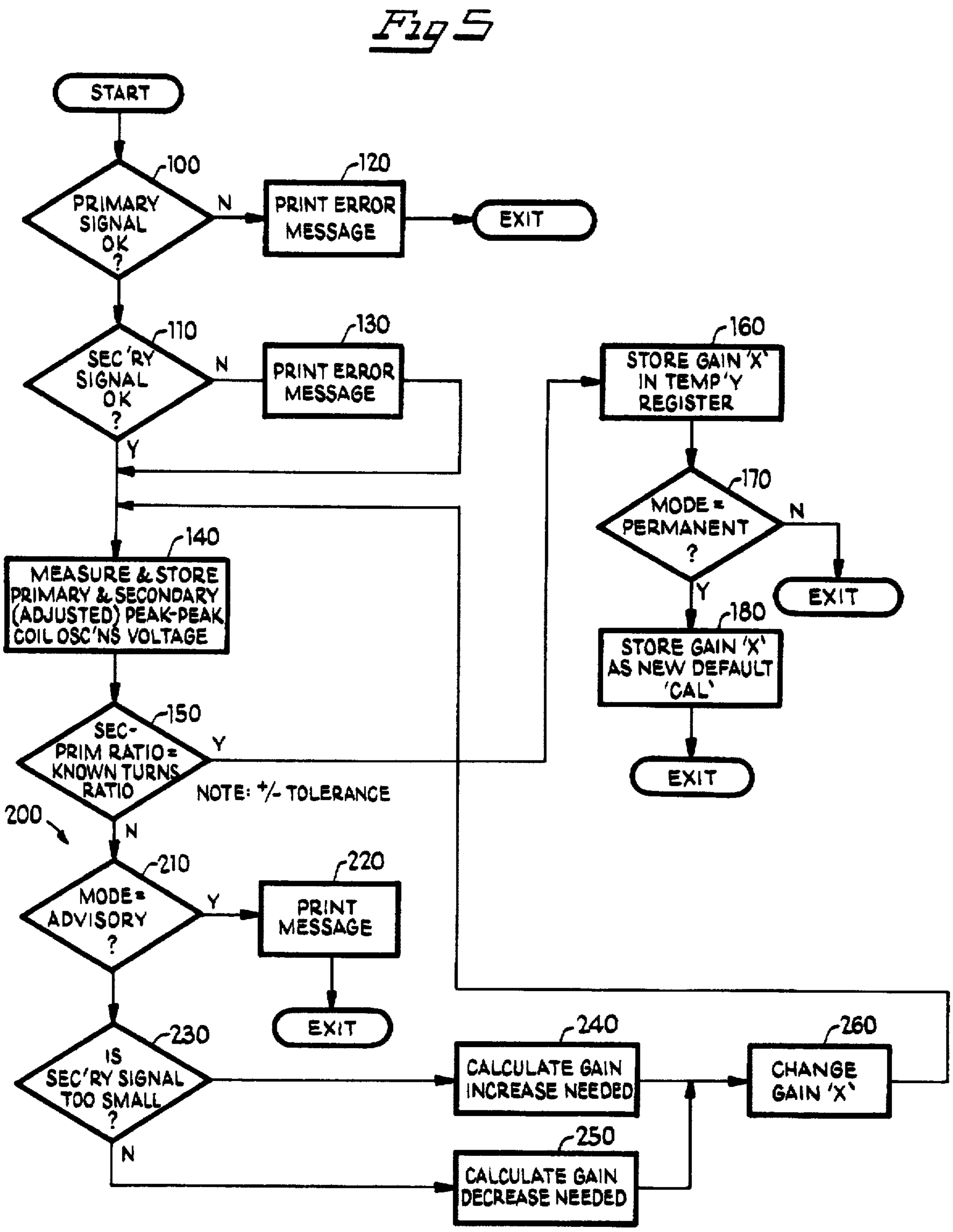
Fig 5
START
100
PRIMARY SIGNAL OK ?
N
120
PRINT ERROR MESSAGE
EXIT
110
SEC'RY SIGNAL OK ?
N
130
PRINT ERROR MESSAGE
Y
140
MEASURE & STORE PRIMARY & SECONDARY (ADJUSTED) PEAK-PEAK COIL OSC'NS VOLTAGE
150
SEC-PRIM RATIO= KNOWN TURNS RATIO
Y
NOTE: +/- TOLERANCE
200
N
210
MODE= ADVISORY ?
Y
220
PRINT MESSAGE
EXIT
230
IS SEC'RY SIGNAL TOO SMALL ?
N
240
CALCULATE GAIN INCREASE NEEDED
250
CALCULATE GAIN DECREASE NEEDED
260
CHANGE GAIN 'X'
160
STORE GAIN 'X' IN TEMP'Y REGISTER
170
MODE= PERMANENT ?
N
EXIT
Y
180
STORE GAIN 'X' AS NEW DEFAULT 'CAL'
EXIT

AUTOMATIC CALIBRATION FOR A CAPACITIVE PICKUP CIRCUIT

BACKGROUND OF THE INVENTION

1. Field of the Invention

The present invention relates to pickup circuits, and more particularly, to a capacitive pickup circuit for an automotive engine analyzer, which pickup circuit can be automatically calibrated.

2. Description of the Prior Art

Engine analyzers have provided the modern mechanic with a powerful tool for accurately checking the ignition system and performance of an engine. Input leads from the analyzer are connectable to various points on the ignition system to sense electrical signals passing therethrough.

Most automotive ignition systems rely on a battery and a generator to supply electrical power to the system, and a distributor having points or a breakerless impulse generation system, which together are used to supply ignition pulses to spark plugs located in each of the cylinders of the engine.

The heart of the ignition system is the ignition coil, which is located between the power supply and the spark plugs. The ignition coil converts the low voltage of the power supply (the battery) to the high voltage pulses typically routed by the distributor to the spark plugs.

The coil is essentially a transformer, with a primary winding and a secondary winding mounted on a common magnetic circuit. One side of each of the primary and secondary windings are typically connected together. The other sides of the primary and secondary windings are used for the low voltage input to the coil and the high voltage output from the coil, respectively. A typical primary to secondary turns ratio is 1:100.

A pickup connected by way of a leadset to an engine analyzer is used to perform tests on the high voltage side of the ignition system, including testing or troubleshooting engine cylinder firings. With a capacitive pickup, in particular, high voltage signals are capacitively sensed by an appropriately positioned pickup. A pickup, therefore, is used to measure and detect ignition system secondary voltages.

The secondary ignition waveform for a breaker points type ignition system is best understood in connection with a description of the relationship and interaction between the primary and secondary ignition circuits. Both the primary and secondary waveform representations 1, 2, shown in FIGS. 1 and 2, respectively, have distinct sections (i.e., a firing section A, an intermediate section B which further includes a coil oscillations portion 3, and a dwell section C) that are generated by specific actions that take place in the ignition system. A book entitled, *How to Read and Interpret Automotive Oscilloscope Patterns*, by Gerald R. Brown, published in 1985 by Reston Publishing Co., Inc., pp. 3–5, 29–31 describes in greater detail the ignition system operation during each such section. The respective coil oscillations portion 3 within the intermediate section B of each of waveforms 1 and 2, has been circled in corresponding FIGS. 1 and 2 for greater emphasis. FIG. 3 additionally shows the primary and secondary waveforms of FIGS. 1 and 2 superimposed on each other. From the superimposed waveform, it should be readily apparent that the respective coil oscillations portions 3 match each other in shape and differ only in voltage. The difference in voltage between the two illustrative waveforms 1, 2 is a factor of 100, which is also equal to the turns ratio of the associated coil.

Both the primary and secondary waveforms 1, 2 were acquired at the same time for the same firing of a spark plug, i.e., a single ignition event. The primary waveform 1 shows a pattern for a typical primary side of an ignition coil, and was measured directly with a voltage probe at 20 volts per division. The secondary waveform 2 was measured using a special high voltage probe at 2000 volts per division. Because the secondary voltage is typically of opposite polarity from the primary, the secondary waveform 2 of FIG. 2 has been inverted for display.

On a typical engine analyzer, the primary voltage is measured accurately by a direct connection to the primary circuit with a voltage probe. The secondary voltage is usually measured capacitively, and is subject to inaccuracies. Most of the inaccuracies can be compensated for by calibrating the engine analyzer to read correctly. There are usually several types of pickups, to accommodate different types of ignition systems. The calibration must be done for each pickup, and can be done in many ways, including adjusting potentiometers, adjusting variable capacitors, or storing a value in memory of a computer which can be used to adjust the gain of an amplifier. The process of calibrating or verification of calibration typically requires some way of accurately measuring the secondary voltage, usually with some other piece of equipment. This makes it impractical for the user of an engine analyzer, or the analyzer itself, to calibrate or verify calibration during normal use.

If an engine analyzer is calibrated at the factory, the secondary voltage readings should stay accurate for that type of ignition system. However, in use by the customer, there are things that can affect the calibration, which fall into two categories.

The first category is things that will permanently affect the calibration of the engine analyzer, such as changing to a new capacitive pickup or new leadset. These types of changes would require a permanent change to the engine analyzer calibration, and is typically done only by qualified service people.

The second category is things that will only affect calibration under some circumstances. Examples of these would include the need to adapt a certain type of pickup to a new type of ignition system, or the use of a pickup on an aftermarket ignition system that affects the amount of capacitance between the ignition secondary and the capacitive pickup. Improper placement of the capacitive pickup can also affect the calibration, but the corrective action would be to reposition the pickup, not to recalibrate the analyzer. The result of these conditions would make it desirable to have available the following options.

For permanent calibration changes, the analyzer should allow for automatic calibration on demand using a known good ignition system with a known turns ratio.

The analyzer should also be capable of calibration verification, running in the background, with error messages that would prompt the user to:

A. Check for proper connection of the secondary pickup, verify that the proper turns ratio parameter is being used, or that the coil could be bad and should be replaced.

B. Allow the user to temporarily recalibrate the analyzer using the detected primary signal and the known turns ratio of the ignition coil to establish reference parameters.

An unsatisfactory pickup connection can cause the pickup to deviate significantly in its reading of the high voltage signal. Ordinarily, the pickup is connected to the high tension wire somewhere between the ignition coil and the distributor or near the secondary windings of the coil, as provided by the manufacturer. If the operator improperly connects the pickup to perform a reading, or alternatively, places the pickup in the wrong place, there is a strong likelihood that the pickup measurement will be wrong.

As already explained, most analyzers provided with pickups are factory pre-calibrated to compensate for variation in signal strength inherently due, in most part, to the construction of the pickup. The calibrated value is usually stored in a non-volatile memory of the analyzer and used to recalibrate future pickup readings on the basis of the stored value. When a malfunctioning pickup is replaced, a new pickup is attached to the old leadset of the analyzer. Unfortunately, the factory calibrated value of the original (replaced) pickup remains. Some analyzers may allow the operator to reset (zero) the calibration value but none provide for automatic field calibration of the newly adapted pickup. Recalibration may also be necessary when adding an adapter to the previously calibrated pickup so as to facilitate coupling of the pickup to a different type of ignition system.

Lastly, the use of after-market ignition components is also known to affect signal strength at pickup connections. Use of after-market components results in readings that vary widely from readings taken from similar systems provided with all original equipment manufacturer (OEM) parts. Consequently, large deviations in pickup readings often cause the unsuspecting automotive technician to diagnose non-defective ignition components as faulty.

A properly calibrated pickup allows an automotive technician to accurately monitor waveform signals, which signals can then be used to diagnose the operation of the engine and isolate faulty components.

It would therefore be a significant improvement over the prior art to be able to provide a pickup circuit, including a pickup, which can be incorporated into an engine analyzer, which would allow the operator to automatically calibrate the pickup circuit on-site, as opposed to in the factory, and which would compensate for significant variations in signal strength due to any of the above-described contributing causes.

SUMMARY OF THE INVENTION

It is a general object of the present invention to provide an automatically calibrated capacitive pickup circuit for an engine analyzer which is economical and easy to manufacture.

It is another object of the present invention to provide a capacitive pickup circuit which detects large deviations in signal strength during measurement, and prompts the automotive technician to check for improper pickup connections.

It is yet another object of the present invention to provide a capacitive pickup circuit which can be temporarily or permanently recalibrated automatically on site and without special equipment, every time a new pickup is used, or an adapter is added, or a new or different length leadset is substituted, or aftermarket components are used in the ignition system under test.

These and other features of the present invention are attained by providing an apparatus for generating a calibration value usable for modifying secondary voltage waveform signals detected at an ignition coil of known secondary-to-primary windings turns ratio. The apparatus includes waveform detecting circuitry including a secondary voltage pickup and a primary lead coupled to corresponding secondary and primary windings of the ignition coil for receiving detected secondary and primary voltage waveform signals, respectively. A waveform comparison is then performed by appropriate routines, and a secondary-to-primary ratio is calculated representative of the signal strength difference between analogous portions of the detected secondary and primary voltage waveform signals. A calibration value is then finally generated on the basis of a comparison between the calculated secondary-to-primary ratio and the known windings turns ratio of the ignition coil.

To automatically calculate a calibration value for modifying the secondary voltage of an ignition coil having primary and secondary winding and a known turns ratio, the following steps are performed. A secondary voltage is detected using a pickup and a primary voltage detected using a primary lead. The detected primary and secondary voltages are monitored over a predetermined portion of an ignition coil firing cycle operation to determine peak-to-peak values for each of the detected primary and secondary voltages. A secondary-to-primary ratio is then calculated on the basis of the peak-to-peak values of the detected primary and secondary voltages. Finally a calibration value is determined as a function of the secondary-to-primary ratio and the known turns ratio.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

FIG. 5 is an operational flow diagram illustrating the steps for calibrating the pickup circuit in FIG. 4 and for taking measurements therewith.

DETAILED DESCRIPTION OF THE PREFERRED EMBODIMENT

Figure 4:
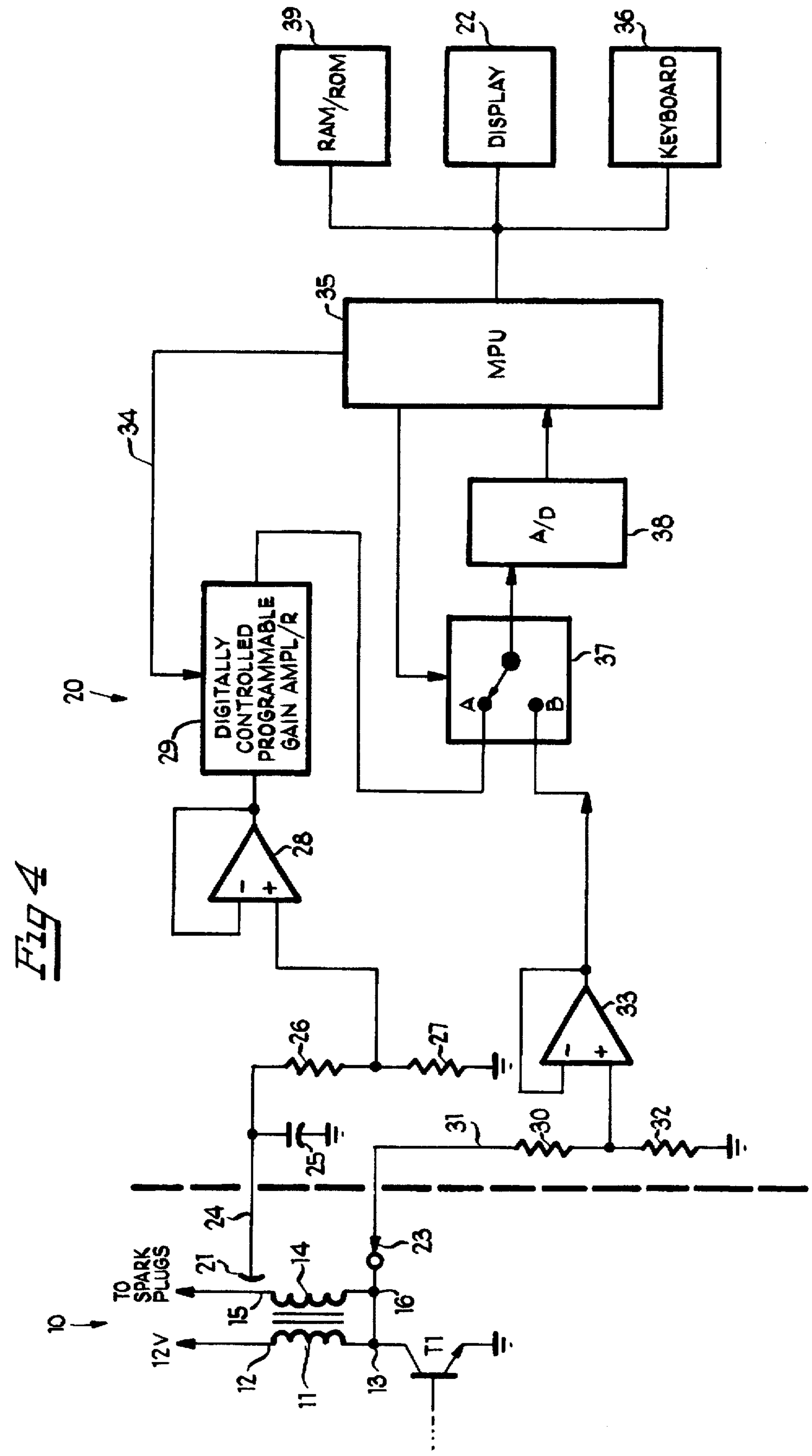
FIG. 4 is a part schematic and part functional block diagram of a capacitive pickup circuit, shown connected to an ignition system, and constructed in accordance with and embodying the features of the present invention.

Referring to FIG. 4, there is illustrated on the left of the broken line, a portion of a spark-ignition system, including an ignition coil 10, having a primary winding 11, coupled at a top lead 12 to a power supply source, such as a 12 V storage battery, providing a low voltage input to the coil. Bottom lead 13 is connected to the switching section of an ignition system, shown partially by switching transistor T1. When T1 is ON (switch closed), a current flows in the primary winding inducing a magnetic field in and around the core of coil 10. When T1 is OFF (switch open), the primary current falls rapidly and the magnetic field collapses. (Note: On some ignitions, the function of T1 may be performed by mechanical breaker points.)

A secondary winding 14, consisting of many turns of fine wire wound on the same core with the primary winding 11, includes a first secondary lead 15 coupled to the secondary ignition components (not shown), which are also a part of the spark-ignition system, and a second secondary lead 16 which is typically coupled to the bottom lead 13 of the primary winding and to the collector of switching transistor T1. The rapid collapse of the magnetic field in the core induces a very high (secondary) voltage in the secondary winding 14. The secondary voltage is led to the spark plugs either directly or in proper sequence by the distributor rotor, the latter which acts as a rotary switch. From the head of the distributor, well-insulated wires carry the secondary voltage to the central electrodes of respective spark plugs. The discharge which takes place between the central electrode and the grounded electrode inside the combustion chamber ignites the air-fuel mixture.

To diagnose the operation of the secondary side of the spark-ignition system, an automatically calibrating capacitive pickup circuit 20, shown principally on the right of the broken line in FIG. 4, is coupled to the spark-ignition system.

For automatic calibration of the pickup circuit 20 to be possible, the following conditions would be necessary:

1. the ignition system must be of a type providing access to the primary winding of the ignition coil, since not all ignitions do;
2. the ignition system must also allow detection of the secondary voltage waveform by way of a capacitive pickup connection;
3. the turns ratio of the ignition coil must be known and the coil must be good; and
4. the analyzer should be able to measure the peak to peak voltage of the coil oscillation or some other area of both the primary and secondary waveforms for a single firing.

Pickup circuit 20 operates in two modes. In signal-monitor mode, secondary voltages detected at a capacitive pickup 21, included therewith, are sensed and then adjusted for accuracy, prior to display on a screen 22, on the basis of a predetermined calibration value. Alternatively, in automatic-calibration mode, pickup circuit 20 is recalibrated by calculating a new calibration value to more accurately adjust detected secondary voltages to compensate for false readings caused by a number of variables, including replacement of a pickup or leadset, addition of an adapter to a same or different pickup, and the sensing of secondary voltages from an ignition system provided with after market components.

The automatically calibrating pickup circuit 20 further includes a primary lead connector 23 adapted for connection to a point on the coil 10 for detecting the primary voltage at the bottom primary lead 13. The capacitive pickup 21 is adapted for capacitive coupling to a point near secondary winding 14 for detecting the secondary voltage at the first secondary lead 15. Proper coupling of connector 23 and pickup 21 to the respective points on the ignition system are necessary to ensure accurate readings.

Pickup 21 capacitively picks up the secondary voltage waveform signal and couples the signal via a fixed length leadset 24 which is connected electrically to the pickup circuit 20 by way of a capacitor 25, scale-adjust resistors 26, 27 and an amplifier 28, as shown in FIG. 4. The output of amplifier 28, in turn, is coupled to a digitally-controlled gain amplifier 29.

Primary lead connector 23 is connected electrically to the resistor 30, via a fixed length leadset 31, inside pickup circuit 20. The other end of resistor 30 is connected to ground through resistor 32, and to buffer amplifier 33. Resistors 30 and 32 form a voltage divider to scale-adjust the primary voltage from the leadset 31 to the buffer amplifier 33. The analog secondary waveform signal received by the gain amplifier 29 is amplified (i.e., voltage adjusted) by an amount proportionate to a variable gain value 'x' transmitted on line 34 from MPU 35, and which gain value 'x' is also a function of the calibration value. Initially, the value of 'x' may be either one of unity-gain or some default, non-unity gain. Provision can also be made for the operator to change the initial, default value of 'x' by entering a new value by way of a keyboard 36. In the preferred embodiment, 'x' has a default initial non-unity gain.

The amplified secondary waveform analog signal from the gain amplifier 29 and the primary waveform signal from buffer amplifier 33 are coupled to respective first and second inputs A, B of signal select multiplexer (MUX) 37. MUX 37 alternately samples the signals at its inputs A and B to provide sample values of the input analog signals to the analog-to-digital (A/D) converter 38. A/D converter 38 digitizes the MUX 37 sample values in the sequence received. The multiplexed waveform signal consisting of interlaced, digitized secondary and primary voltage waveform signals is, in turn, communicated to the microprocessor (MPU) 35, which is coupled to a RAM/ROM onboard memory 39 including appropriate software routines, for processing signals accordingly.

Figure 1:
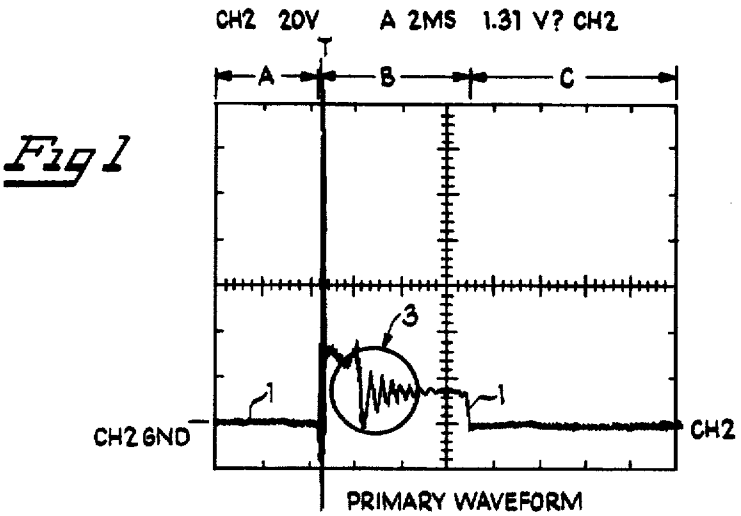
FIG. 1 illustrates the voltage waveform at a primary lead of an ignition coil during a single ignition event.

In this regard, the multiplexed waveform signal is analyzed and that portion corresponding to the coil oscillations area of both the secondary and primary voltage waveform signals is detected. As is well understood in the art, the coil oscillations area of an ignition voltage waveform signal is that portion of the signal where respective portions of the waveforms of the secondary and primary voltage signals match each other in shape, but differ only in voltage (see FIGS. 1–3).

The inventor of the present invention has found that the coil oscillations area of a non-calibrated, capacitively-detected secondary voltage has the same shape as the coil oscillations area of its corresponding primary voltage, though the voltage levels are different. Consequently, by detecting and measuring the voltage level at a point within the oscillations area of a capacitively-detected secondary voltage waveform and comparing that voltage level to the voltage level at an almost identically corresponding portion of the associated primary voltage waveform, a secondary-to-primary voltage level ratio can be determined. Furthermore, because the coil oscillations area of the respective waveforms are substantially sinusoidal in shape, the accuracy of the ratio measurement can be improved by looking for and detecting peak-to-peak values, instead of isolated points on a curve, of the respective sinusoidal waveforms within their associated coil oscillations areas.

From the measured secondary and primary peak-to-peak values, a difference in voltage levels is therefore detected and a ratio determined. Since a non-calibrated secondary signal's voltage level is not accurate, adjustment can be made once the peak-to-peak value ratio is determined. This adjustment involves amplifying the secondary voltage waveform to bring its peak-to-peak voltage in sync with the known, true secondary voltage level at the ignition coil. For a coil windings ratio of 100:1, the true secondary voltage is 100 times that of the primary voltage, which primary voltage is measured directly, not capacitively, and therefore is accurately detected by the primary lead connector 23. Thus, a measured voltage difference between secondary and primary of less than or greater than 100:1, is an indicator that the pickup circuit will need to be calibrated before further measurements are to be taken using the pickup 21. Since some minimal calibration is always necessary during start-up, the pickup circuit 20 automatically adjusts the secondary voltage readings by some initial or default value. This value is the gain value 'x' described above and which value is adjusted permanently (or temporarily) at the end of a calibration procedure.

In the preferred embodiment, MPU 35 analyzes the multiplexed waveform signal from A/D converter 38, consisting of digitally sampled portions of the secondary signal from gain amplifier 29 and of the primary signal from buffer amplifier 33, to detect the following:

(a) the portion of the multiplexed waveform signal including the digitally sampled coil oscillations area of the associated secondary and primary signals; and (b) the respective peak-to-peak values during a single cycle within the respective coil oscillations area of each of the secondary and the primary voltage waveform signals.

For the pickup circuit 20 to be properly calibrated, the calculated secondary-to-primary ratio should equal the known turns ratio of the ignition coil. In accordance with the preferred embodiment, when the calculated ratio is more or less than the known turns ratio, MPU 35 automatically increases (or decreases) the gain value 'x' to the gain amplifier 29 by a predetermined incremental amount. When 'x' is changed, the secondary voltage waveform signal from gain amplifier 29 is amplified by an amount proportionate to the change in 'x'. The amplifier 29 output is then multiplexed with the corresponding incoming primary voltage waveform signal at MUX 37. The multiplexed signal is then digitized by the A/D converter 38 for interpretation by MPU 35. The MPU 35 analyzes the multiplexed waveform signal to generate new peak-to-peak values, associated with the coil oscillations area of the recently amplified secondary signal from gain amplifier 29. From this, a new secondary-to-primary ratio is calculated. The pickup circuit 20 thus enters a continuous loop, under MPU 35 control, incrementally increasing (or decreasing) the gain 'x' to the gain amplifier 29, until finally the measured secondary-to-primary ratio is within a predetermined range of the known turns ratio of the coil. The current value of 'x', or its arithmetic equivalent, then becomes the newly calculated calibration value for the pickup circuit 20.

In the preferred embodiment, the pickup circuit 20 can be set for operation either in permanent or temporary calibration mode. When the pickup circuit 20 is set for permanent calibration mode, a new calibration value is stored in non-volatile memory permanently replacing the current default value. In temporary or non-permanent mode, a calculated calibration value is merely used to temporarily automatically calibrate subsequently received, capacitively-detected, secondary voltage waveform signals. When the system is reinitialized or powered-up, the permanent system default will override any temporary calibration defaults derived from an earlier power-up operation.

In the preferred embodiment described above, the gain value 'x' is incrementally adjusted (downwards or upwards as necessary) until the measured ratio and the known ratio are about equal. In an alternative embodiment, once an initial secondary-to-primary ratio is calculated, an arithmetic operation may be performed to determine the arithmetic difference between the calculated ratio and the known turns ratio. This difference is then used to arithmetically determine an appropriate value of 'x' which when input to the gain amplifier 29 would cause the coil oscillations area of the capacitively-detected secondary signal to be matched in shape to the actual secondary voltage at the coil.

The pickup circuit 20, as previously explained, is envisioned as part of a device, such as an engine analyzer. It should be appreciated therefore that MPU 35 may be the central processor of the analyzer and serves to coordinate memory addressing and accessing, perform data processing, as well as supervise control and monitoring of input/output devices, such as keyboards and cathode ray tubes, included on engine analyzers.

The software that performs the automatic calibration should also include a sub-routine that is called when the capacitive pickup is first used during a test sequence, or called on demand by the user.

Referring to FIG. 5, there is illustrated a general flow diagram of the main sub-routine for automatically calibrating the capacitive pickup circuit 20 for controlling the MPU 35.

Figure 2:
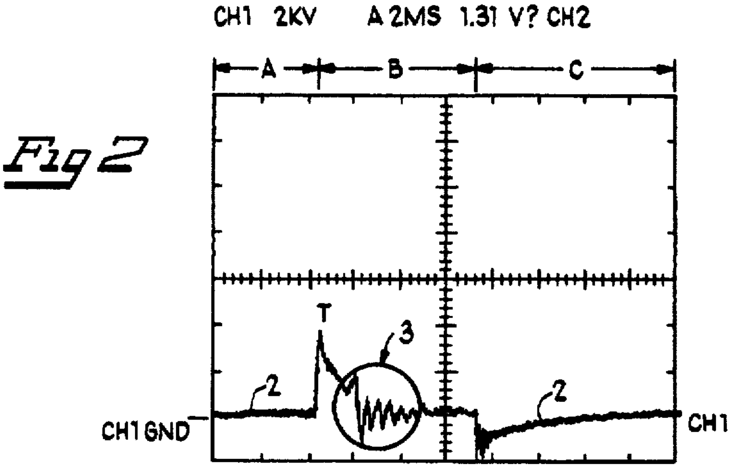
FIG. 2 illustrates the inverted voltage waveform at a secondary lead of the ignition coil during the same ignition event.
Figure 3:
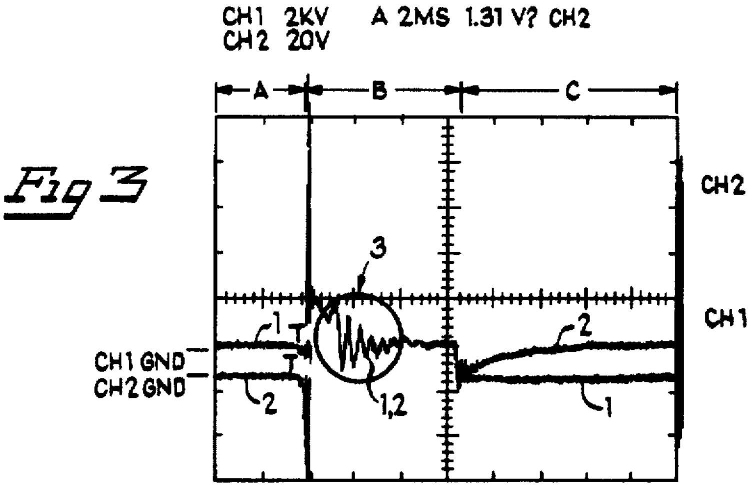
FIG. 3 illustrates the voltage waveforms of FIGS. 1 and 2 with their respective coil oscillations portions superimposed to show the match in shape.

The operational steps of pickup circuit 20 at power-up according to the preferred embodiment are as follows. After the primary lead 23 connector and capacitive pickup 21 are connected for voltage waveform signal detection, the automatic calibration sub-routine of FIG. 2 is initiated. First, the primary (100) and the secondary (110) voltages are evaluated to determine whether the primary lead connector 23 and pickup 21 are appropriately connected, and to print appropriate error messages (120, 130) otherwise. Secondly, the primary and secondary peak-to-peak primary and secondary voltage waveform signals detected at the primary lead and output from the gain amplifier 29, respectively, are measured and stored in temporary memory (140). Immediately following, these signals are multiplexed, sampled, digitized and interpreted, all under MPU 35 control, in the manner described above. The secondary peak-to-peak voltage is then finally compared against the primary peak-to-peak voltage (150) and if within a predetermined allowable range of the known turns ratio of the ignition coil, the initial gain value 'x' is stored in a temporary register (160).

If the operator has selected permanent mode (170, 180), the present value of 'x' becomes the new default calibration 'CAL' value and the program exits the sub-routine. Else, the gain value 'x' remains in the temporary register becoming a temporary default calibration value (180). When the calculated secondary-to-primary ratio is different from the known turns ratio, the sub-routine enters a different path (200). First in this path, a determination (210) is made whether the calibration is to be merely advisory, in which case the default calibration is to remain unchanged, and a print message displayed (220). If not advisory, a determination is made (230) and the gain value 'x' is increased or decreased on the basis of whether the calculated ratio is smaller (240) or bigger (250) than the known turns ratio. The changed gain value 'x' (260) proportionately adjusts the amplified secondary voltage waveform signal at the output of gain amplifier 29 increasing or decreasing its voltage as necessary to bring it closer to the actual waveform at the secondary winding 14 of the coil.

Step(s) (240, 250) relating to the calculation of a final gain 'x' corresponding to the calibration value, can be optionally achieved in any number of equivalent ways, including using an arithmetic number-crunching scheme or an incremental increase/decrease scheme, both of which schemes were described above.

In the preferred embodiment, 'x' is assigned a default value 'CAL'. As a result, the pickup circuit 20, by way of gain amplifier 29 and gain input 'x' immediately adjusts/amplifies detected secondary voltages before the initial ratio-calculating procedure is initiated. Alternatively, a unity-gain value (no initial adjustment) or a user-input value (user change initial default adjustment) are also possible. Furthermore, once the initially detected signals are sampled and a ratio is calculated, it should be quite apparent that an appropriate table lookup scheme can be utilized for the purpose of determining the proper calibration values, and accordingly the value of 'x', which when communicated to gain amplifier 29 secondary signal adjustment/calibration is made possible.

Once the pickup device is calibrated and the gain offset value retrievably stored in memory for the purpose of adjusting future readings, taken along the secondary side of the ignition system by the pickup 21, an operator can accurately monitor secondary signal response to determine suspect component operation and adequately isolate problems associated therewith.

Because the presently disclosed method of calibrating voltage readings from the secondary side is based on a known value reference, namely, the known, fixed 'turns' ratio of the ignition coil, and because the sources of error, such as may result from using a new pickup, a pickup adapter, a new leadset, or from use of after-market components, affect pre-calibrated voltage readings on the secondary by a fixed amount, irrespective of signal strength, secondary signals read by the pickup can be readily calibrated. These calibrated signals are highly accurate and graphically displayable for diagnostic analysis by an automotive technician. Also, because the initial calibration procedure of the pickup device is automatic, that is to say that all the technician need do is connect the probes as instructed, calibration is quick and easy.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. Apparatus for generating a calibration value usable for modifying secondary voltage waveform signals detected at an ignition coil of known secondary-to-primary windings turns ratio, said apparatus comprising:

waveform detecting circuitry including a secondary voltage pickup and a primary lead coupled to corresponding secondary and primary windings of the ignition coil for receiving detected secondary and primary voltage waveform signals, respectively;

waveform comparison means, coupled to the waveform detecting circuitry, for calculating a secondary-to-primary ratio representative of the signal strength difference between analogous portions of said detected secondary and primary voltage waveform signals; and means for generating the calibration value on the basis of a comparison between the calculated secondary-to-primary ratio and the known windings turns ratio of the ignition coil.

2. The apparatus of claim 1, wherein said pickup is a capacitive pickup.

3. The apparatus of claim 1, further comprising waveform multiplexing circuitry alternately sampling said secondary and primary waveform signals over a predetermined period to generate a single interlaced waveform signal;

said waveform comparison means including means for analyzing said single interlaced waveform signal to detect a multiplexed portion thereof which includes the analogous portions of said detected secondary and primary voltage waveform signals;

means for isolating each sampled secondary voltage waveform signal from its associated sampled primary voltage waveform signals within the multiplexed portion; and means for generating said secondary-to-primary ratio on the basis of a comparison between associated isolated ones of said sampled secondary and primary voltage waveform signals.

4. The apparatus of claim 3, wherein said apparatus is a microprocessor based device.

5. The apparatus of claim 3, wherein said circuitry further includes an analog-to-digital converter for converting the analog detected primary and secondary voltages to digital signals for input to said waveform multiplexing circuitry.

6. The apparatus of claim 3, wherein said means for generating said secondary-to-primary ratio includes means for detecting associated peak-to-peak values of said secondary and primary voltage waveform signals.

7. A pickup circuit selectively operable in either a signal-monitor mode or in automatic calibration mode, in which calibration mode the pickup circuit, in response to the detection of primary and secondary voltage waveform signals at an ignition coil having known turns ratio, generates a calibration value usable by the pickup circuit in signal-monitor mode to calibrate a secondary voltage waveform signal detected by a pickup, said pickup circuit comprising:

a programmable gain amplifier, responsive to the detected secondary voltage waveform signal and to a gain control feedback signal for generating an amplified secondary voltage waveform signal wherein said feedback signal has an initial predetermined value in calibration mode and has a calibration value in signal monitor mode;

a waveform multiplexing circuit selectively operable in calibration mode for alternately sampling said primary and said amplified secondary voltage waveform signals over a predetermined period to generate a single interlaced waveform signal;

waveform comparison means responsive to said single interlaced waveform signal for calculating a secondary-to-primary ratio representative of the signal strength difference between analogous portions of said primary and said amplified secondary voltage waveform signals; and means for generating the calibration value on the basis of said secondary-to-primary ratio and the known turns ratio of the ignition coil.

8. The pickup circuit of claim 7, wherein said pickup is a capacitive pickup.

9. The pickup circuit of claim 7, wherein said waveform multiplexing circuit comprises:

a multiplexer, alternately sampling the detected primary and the amplified voltage waveform signals to generate a multiplexed analog waveform signal; and a microprocessor for controlling sampling by said multiplexer.

10. The pickup circuit of claim 9, wherein said waveform multiplexing circuit further comprises:

an analog-to-digital converter for digitizing the multiplexed analog waveform signal to output a plurality of digital sample values together defining said single interlaced waveform signal.

11. The pickup circuit of claim 10, wherein said waveform comparison means includes:

means for monitoring the plurality of digital sample values over a predetermined cycle of ignition coil operation to detect a primary voltage waveform signal peak value and an associated amplified secondary voltage waveform signal peak value; and means for determining the secondary-to-primary ratio on the basis of said detected primary and secondary peak values.

12. The pickup circuit of claim 7, wherein said amplifier is a digitally-controlled programmable gain amplifier.

13. The pickup circuit of claim 7, and further comprising means for storing the calibration value.

14. A method for automatically calculating a calibration value for modifying the secondary voltage of an ignition coil having primary and secondary winding and a known turns ratio, the method comprising the steps of:

detecting the secondary voltage using a pickup;

detecting the primary voltage using a primary lead;

monitoring the detected primary and secondary voltages over a predetermined portion of an ignition coil firing cycle operation to determine peak values for each of said detected primary and secondary voltages;

calculating a secondary-to-primary ratio on the basis of the peak values of said detected primary and secondary voltages; and calculating a final calibration value as a function of the secondary-to-primary ratio and the known turns ratio.

15. The method of claim 14, further comprising the step of storing the final calibration value.

16. The method of claim 14, further comprising the step of prompting an operator to verify that the pickup lead connection is proper when the calibration value exceeds predetermined levels.

17. The method of claim 14, further comprising the step of digitizing the detected signals prior to the step of monitoring.

18. The method of claim 14, further comprising the step of initially adjusting, by a predetermined gain value, the signal strength of said detected secondary voltages prior to the step of monitoring.

19. The method of claim 14, further comprising the steps of initially adjusting said detected secondary voltages by a predetermined gain value to generate an initial secondary-to-primary ratio and incrementally readjusting said initial gain value on the basis of a most recently calculated secondary-to-primary ratio, said final calibration value being a function of a final gain value causing the secondary-to-primary ratio to have a value about equal to said known turns ratio.

20. The method of claim 14, comprising the steps of initially adjusting said detected secondary voltages by a predetermined gain value to generate an initial secondary-to-primary ratio, and on the basis of said initial secondary-to-primary ratio and said known turns generating a final gain value related to said final calibration value.

21. The method of claim 20, wherein the step of generating said final calibration value includes deriving values from a lookup table.

* * * * *